(12) United States Patent
Choi

(10) Patent No.: US 10,564,692 B2
(45) Date of Patent: Feb. 18, 2020

(54) MEMORY DEVICE AND POWER REDUCTION METHOD OF THE SAME MEMORY DEVICE

(71) Applicant: Winbond Electronics Corp., Taichung (TW)

(72) Inventor: Myung-Chan Choi, San Jose, CA (US)

(73) Assignee: Windbond Electronics Corp., Taichung (TW)

( * ) Notice: Subject to any disclaimer, the term of this patent is extended or adjusted under 35 U.S.C. 154(b) by 66 days.

(21) Appl. No.: 15/937,819

(22) Filed: Mar. 27, 2018

(65) Prior Publication Data
US 2019/0304530 A1    Oct. 3, 2019

(51) Int. Cl.
G06F 1/32 (2019.01)
G11C 11/4074 (2006.01)
G11C 11/409 (2006.01)
G11C 11/406 (2006.01)

(52) U.S. Cl.
CPC .............. *G06F 1/32* (2013.01); *G11C 11/409* (2013.01); *G11C 11/4074* (2013.01); *G11C 11/40615* (2013.01)

(58) Field of Classification Search
CPC .......... G11C 11/4074; G11C 11/40615; G11C 11/409
See application file for complete search history.

(56) References Cited

U.S. PATENT DOCUMENTS

| 5,404,543 A * | 4/1995 | Faucher | G06F 1/3215 |
| | | | 713/323 |
| 7,813,209 B2 | 10/2010 | Parent | |
| 7,908,501 B2 | 3/2011 | Kim et al. | |
| 9,570,145 B2 | 2/2017 | Ware et al. | |
| 2002/0163846 A1 | 11/2002 | Taruishi et al. | |
| 2006/0212651 A1 * | 9/2006 | Ashmore | G06F 11/1441 |
| | | | 711/113 |

(Continued)

FOREIGN PATENT DOCUMENTS

| CN | 101641745 | 2/2010 |
| TW | I242213 | 10/2005 |

OTHER PUBLICATIONS

Winbond, the technical specification of "W978H6KB / W978H2KB,", May 22, 2014, pp. 1-122.

(Continued)

*Primary Examiner* — Ajay Ojha
(74) *Attorney, Agent, or Firm* — JCIPRNET

(57) ABSTRACT

The disclosure is directed to a memory device and a power reduction method of the same memory device. In an aspect, the disclosure is directed to a memory device which includes not limited to a plurality of memory banks, each having a power switch, a plurality of functional blocks for reading and writing to the plurality of memory banks and include a plurality of power switches as each functional block of the plurality of function blocks has a different power switch which turns on or turns off the functional block, a mode register circuit having a plurality of mode registers which determines whether one or more of the plurality of memory banks would maintain data storage or not, and a control logic circuit for either powering on or powering off each of the plurality of memory banks and each of the plurality of the functional blocks.

12 Claims, 9 Drawing Sheets

(56) References Cited

U.S. PATENT DOCUMENTS

| | | | |
|---|---|---|---|
| 2008/0040562 A1* | 2/2008 | Gower | G06F 1/206 |
| | | | 711/154 |
| 2008/0235528 A1* | 9/2008 | Kim | G06F 1/3225 |
| | | | 713/324 |
| 2012/0218812 A1 | 8/2012 | Takagi et al. | |
| 2018/0366422 A1* | 12/2018 | Matsubara | H01L 23/645 |

OTHER PUBLICATIONS

"Office Action of Taiwan Counterpart Application," dated Sep. 3, 2019, p. 1-p. 10.

* cited by examiner

MEMORY DEVICE AND POWER REDUCTION METHOD OF THE SAME MEMORY DEVICE

TECHNICAL FIELD

The disclosure is directed to a memory device and a power reduction method of the same memory device.

BACKGROUND

Recently, low power consumption in the field of memory devices has become important especially in the field of dynamic random-access memory (DRAM). A DRAM device or a DRAM chip has several modes of operation including several power saving modes. Besides the active mode in which the DRAM would operate normally, the power saving modes of the DRAM device may include an idle mode, a standby power-down mode, a self refresh mode, and a deep power down mode. The deep power down mode is an extreme power saving mode and does not guarantee data to be safely stored as typically all internal generators operating under the deep power down mode are disabled. For the self refresh mode, data stored in memory cells are guaranteed to be stored safely, but the self refresh mode typically require higher power consumption than other types of power saving modes. In order to guarantee that the data are stored safely, a memory device must consume additional power to perform self refresh operation periodically.

FIG. 1 is a state diagram which shows a conventional memory device entering one of several power saving modes when the memory device is in the idle state. Referring to FIG. 1, in S101, the memory device is assumed to have received a power on instruction. In response to powering on, the memory device would undergo an initialization procedure in a predefined manner and also a reset command would be issued. The initialization procedure would include resetting the memory device to an optimal operating condition as required by the specification of the memory device (S102). In step S103, the memory device would enter the idle mode waiting to be accessed. In step S104, the memory device may enter an active mode so as to perform a typical operation which may include a read/write procedure.

However, once the memory device is in the idle mode S103, the memory device may enter one of three power saving mode which may include a deep power down mode S105, a self refresh mode S106, and a standby power down mode S107. When operating under the deep power down mode S105, all the power generators of the memory device would typically be turned off. When operating under the self refresh mode S106, some or all power generators of the memory device may turn on but powers for functional blocks that are not related to storing data could be switched off or cutoff. Similarly, when operating under the standby power down mode S107, some or all power generators of the memory device may turn on but powers for functional blocks that are not related to storing data could be switched off or cutoff.

Table 1 shows a comparison among various power saving modes as previously described. According to Table 1, the deep power down mode may save the most power relative to other power saving modes but does not guarantee data storage. The standby power down mode achieves worse power saving than the deep power down mode but also does not guarantee data storage. The self refresh mode does guarantee data storage but at the cost of having worse power saving than the deep power down mode.

TABLE 1

| Mode | Deep Power Down | Standby Power Down | Self Refresh |
|---|---|---|---|
| Power Saving | Best | Good | Good |
| Data Maintain | No | No | Yes |

For further details with regard to the power saving modes, technical specification W978H6KB/W978H2KB is incorporated by reference.

FIG. 2 shows a hardware block diagram of a conventional DRAM device. The DRAM device may include not limited to a memory 201, a control logic circuit 202 electrically connected to a mode register circuit 203, a refresh control & counter 204, a row address multiplexer 205, a bank control logic circuit 206, a column address counter & latch 207, a plurality of row address latch & decoders 208, a plurality of column decoders 209, a I/O gating & DM masking logic circuit 210, a sense amplifier 211, a read/write control logic circuit & Din buffer/Dout Drivers 212, and so forth. Technical specification W978H6KB/W978H2KB may contain further details with regard to the functions of each of the above described blocks.

Essentially, the control logic circuit would receive information from an external command, a memory address, and values stored in the mode registers 203 to at least determine whether to read from or to write data into the memory array 201 as well as whether to enter the active mode S104, the deep power down mode S105, the self refresh mode S106, the standby power-down mode S107, and etc. Such information could be received from a central processor or a controller that is situated external to the memory device 200. The control logic circuit 202 would read from the mode registers 203 to determine whether a read operation or a write operation is to be performed and would also use the receive address (such as which memory bank, sector, page, etc.) to determine where to read or write the data by controlling the row address multiplexer 205, the bank control logic 206, and the row address latch & decoders 208 to determine the bank location (e.g. bank 0, bank 1, bank 2, etc.) and the row address within the determined bank location. Similarly, the control logic circuit 202 would read from the mode registers 203 to determine whether a read operation or a write operation is to be performed and would also use the received address (such as which memory bank, sector, page, etc.) to determine where to read or write the data by controlling the column address counter & latch 207 and the bank control logic 206, and the column decoders 209 to determine the bank location (e.g. bank 0, bank 1, bank 2, etc.) and the column address within the determined bank location.

For the memory device of FIG. 2, there could be several internal power generators and power buses. For example, the power generator and power buses would generate internal voltage (VINT) for periphery circuits (e.g. 202~212), VINT for the memory array 201, VPP (high voltage) for memory array 201, VBB (negative voltage) for memory array 201, and etc. The internal power generators could all be generated from the same power supply chip and share the same power bus. This could make power saving rather limited.

For example, an application may want to maintain data only in memory bank 0 but does not care for other banks within the memory array 201. Then the conventional self refresh mode may provide self refresh only for memory array bank 0 to maintain the data within bank of the memory array 201 as only bank 0 is intended to consume power during the self refresh operation. However, other banks of the memory array 201 would likely still consume leakage current because internal power generators have connected all memory array banks together. Currently, the leakage current of each individual memory bank is not trivial, and the sum of the leakage current of the entire memory array 201 could be significant. The power consumption due to the leakage current might be even larger than the power consumption of the self refresh current within memory device 200. Similarly, in the periphery circuits (e.g. 202~212), even though only certain periphery circuits active under the self refresh mode, other periphery circuits not actively supporting the self refresh operation also consume leakage currents because VINT is all connected together. This means that the conventional self refresh mode may not achieve decent power reduction as intended.

In the very near future, it is perceivable that some memory applications not only would require an extreme power saving at a similar level as the deep power down mode but also require at least some of the data stored in a memory device to be guaranteed. Therefore, a mechanism which would be able to achieve extreme power saving but at the same time safely preserve data stored in a memory device would be required.

SUMMARY OF THE DISCLOSURE

In order to address the above described challenges, the disclosure provides a memory device and a power reduction method of the same memory device.

In an aspect, the disclosure is directed to a memory device which includes not limited to: a plurality of memory banks, each having a different power switch which either turns on or turns off each corresponding memory bank of the plurality of memory banks; a plurality of functional blocks for reading and writing to the plurality of memory banks and having a plurality of power switches as each functional block of the plurality of function blocks has a different power switch which either turns on or turns off the functional block; a mode register circuit having a plurality of mode registers as each mode register of the plurality of mode registers determines a memory bank of the plurality of memory banks to maintain data or to disconnect from a power generator which corresponds to the memory bank; and a control logic circuit for either powering on or powering off each of the plurality of memory banks and each of the plurality of the functional blocks by reading from the mode register circuit.

In an aspect, the disclosure is directed to a power reduction method used by a memory device. The method includes not limited to disposing, for each memory bank of a plurality of memory banks, a different power switch which either turns on or turns off each memory bank associated with each power switch; disposing, for each function block of a plurality of functional blocks configured for reading and writing to the plurality of memory banks, a different power switch which either turns on or turns off each functional block associated with each power switch; setting a memory bank of the plurality of memory banks to maintain data or to disconnect from a power generator which corresponds to the memory bank by using a mode register circuit having a plurality of mode registers as each mode register of the plurality of mode registers sets each memory bank to maintain data or to disable the switch; and configuring a control logic circuit for either powering on or powering off each of the plurality of memory banks and each of the plurality of the functional blocks by reading from the mode register circuit.

In order to make the aforementioned features and advantages of the disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the disclosure and is therefore not meant to be limiting or restrictive in any manner. Also the disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
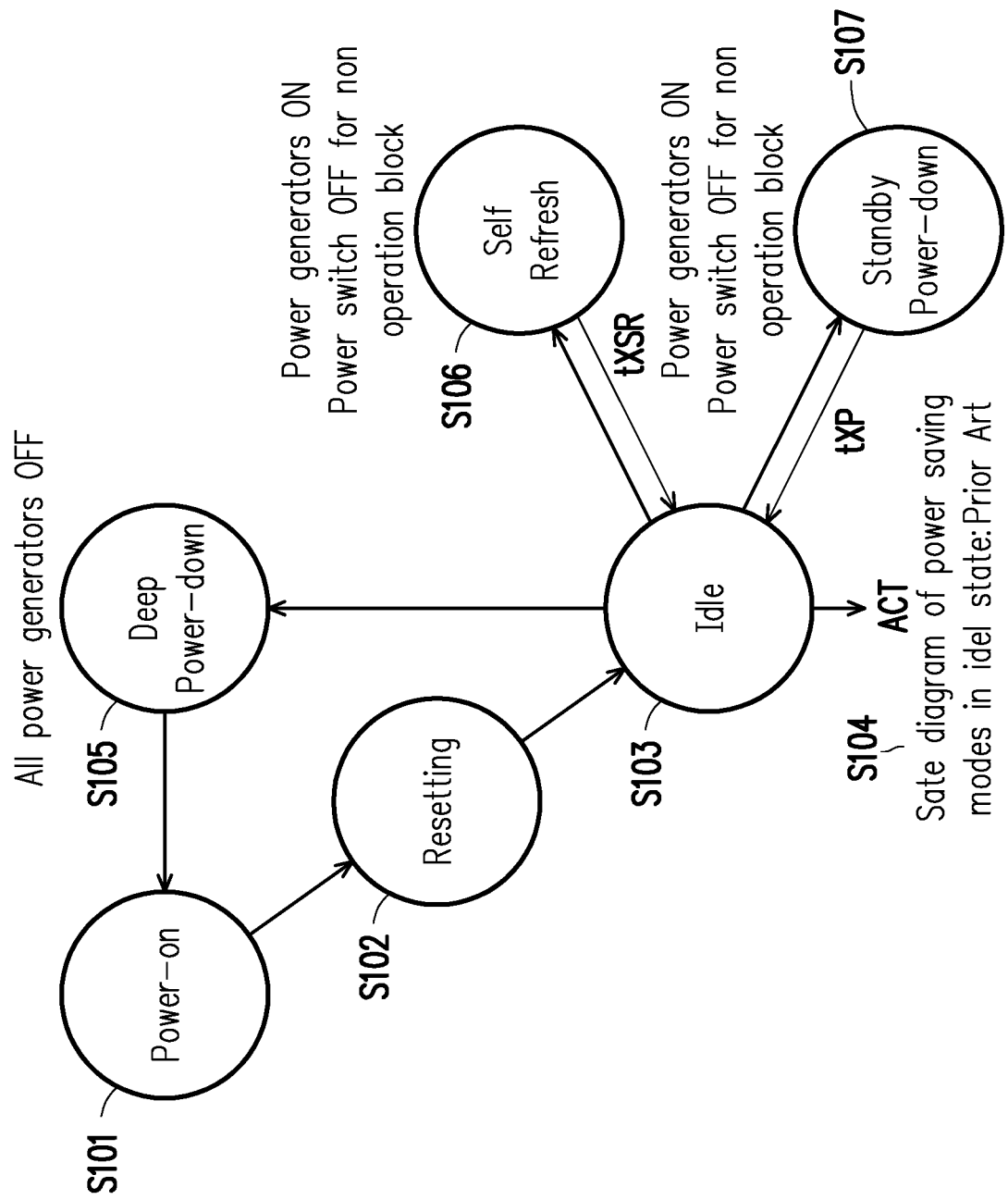
FIG. 1 is a state diagram which shows a memory device entering one of several power saving modes when the memory device is in the idle state.

Reference will now be made in detail to the present exemplary embodiments of the disclosure, examples of which are illustrated in the accompanying drawings. Wherever possible, the same reference numbers are used in the drawings and the description to refer to the same or like parts.

In order to achieve a high level of power saving equivalent to the above described deep power down mode but at the same time guarantee data storage, the disclosure proposes a deep power down self refresh (DSR) mode by which not only almost the same power consumption as deep power down mode could be achieved but also data in several blocks of memory or several banks of memory could be achieved. The disclosure also proposes the hardware implementations by which the DSR mode could be accomplished. In this disclosure, FIG. 3 and FIG. 4 and their corresponding written descriptions serve to explain the basic concept of the disclosures, and this disclosure also provides several exemplary embodiments as shown by FIG. 5~FIG. 9 and their corresponding written descriptions to further elucidate the concept of the disclosures.

Figure 3:
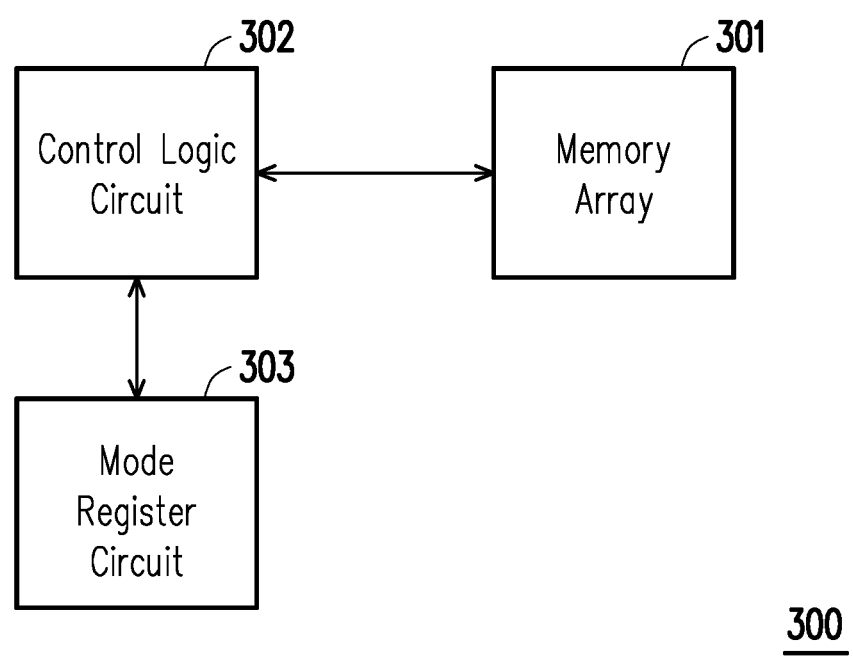
FIG. 3 is a hardware block diagram of a memory device in accordance with one of the exemplary embodiments of the disclosure.

FIG. 3 is a hardware block diagram of a memory device in accordance with one of the exemplary embodiments of the disclosure. The memory device could be but not limited to a DRAM device. The memory device 300 may include not limited to a memory array 301, a control logic circuit 302, a mode register circuit 303, and a plurality of functional blocks (i.e. periphery circuits; not shown). The control logic circuit 302 is electrically coupled to the memory array 301 and the mode register circuit 303. The memory array 301 may include a plurality of memory banks, each having a different power switch which either turns on or turns off each memory bank that corresponds to each of the different power switch. A plurality of functional blocks (e.g. 204~212, shown in FIG. 6) are designed for reading and writing to the plurality of memory banks and containing a plurality of power switches as each functional block could be disposed with a different power switch which either turns on or turns off the corresponding functional block. The mode register circuit 303 may include a plurality of mode registers as each mode register may determine whether a specific memory bank would maintain data or not maintain data at all. If a specific memory bank is not to maintain data, the mode register which corresponds to the specific memory bank may contain a value which shows that the memory bank will be disconnected from its power source. The control logic circuit 302 would control most of the functional blocks for either powering on or powering off individual memory banks based on the information stored within the mode register circuit.

In one of the exemplary embodiments, the control logic circuit 302 would power on or power off each individual memory bank and each of the plurality of the functional blocks which supports each individual memory bank by switching either on or off each power switch of the plurality of memory banks and/or by switching either on or off each power switch of the plurality of the functional blocks. The control logic circuit 302 would determine whether to switch on or off each power switch of the plurality of memory banks and the plurality of the functional blocks according to an external command and a setting value of each mode register which corresponds to each memory bank. The external command would be any one of an active command, a self refresh command, a deep self refresh (DSR) command, a deep power down command, a standby power-down command, and etc. Moreover, the control logic circuit is further configured to turn on power switches of functional blocks which are necessary for maintaining the data of the selected memory banks and turn off power switches of remaining functional blocks which are not necessary for maintaining the data of the selected memory banks.

In one of the exemplary embodiments, in response to receiving the DSR command, all power generators of unselected memory banks and functional blocks which are not necessary for maintaining the data of the selected memory banks are turned off. Further, all power generators that have been turned off in response to receiving the DSR command are turned back on in response to receiving a DSR exit command. The functional blocks which are left on may include a refresh control and counter, a row address multiplexer, a bank control logic circuit, and a row address latch and decoder which are for supporting a selected memory bank.

In one of the exemplary embodiments, the memory device 300 may further include a deep self refresh (DSR) power control signal generator. The generator may contain not limited to a flip flop which receives the DSR command from the mode register circuit and a plurality of AND gates which receives an output of the flip flop and the setting value of each mode register for either powering on or powering off each of the plurality of memory banks and each of the plurality of the functional blocks.

Figure 4:
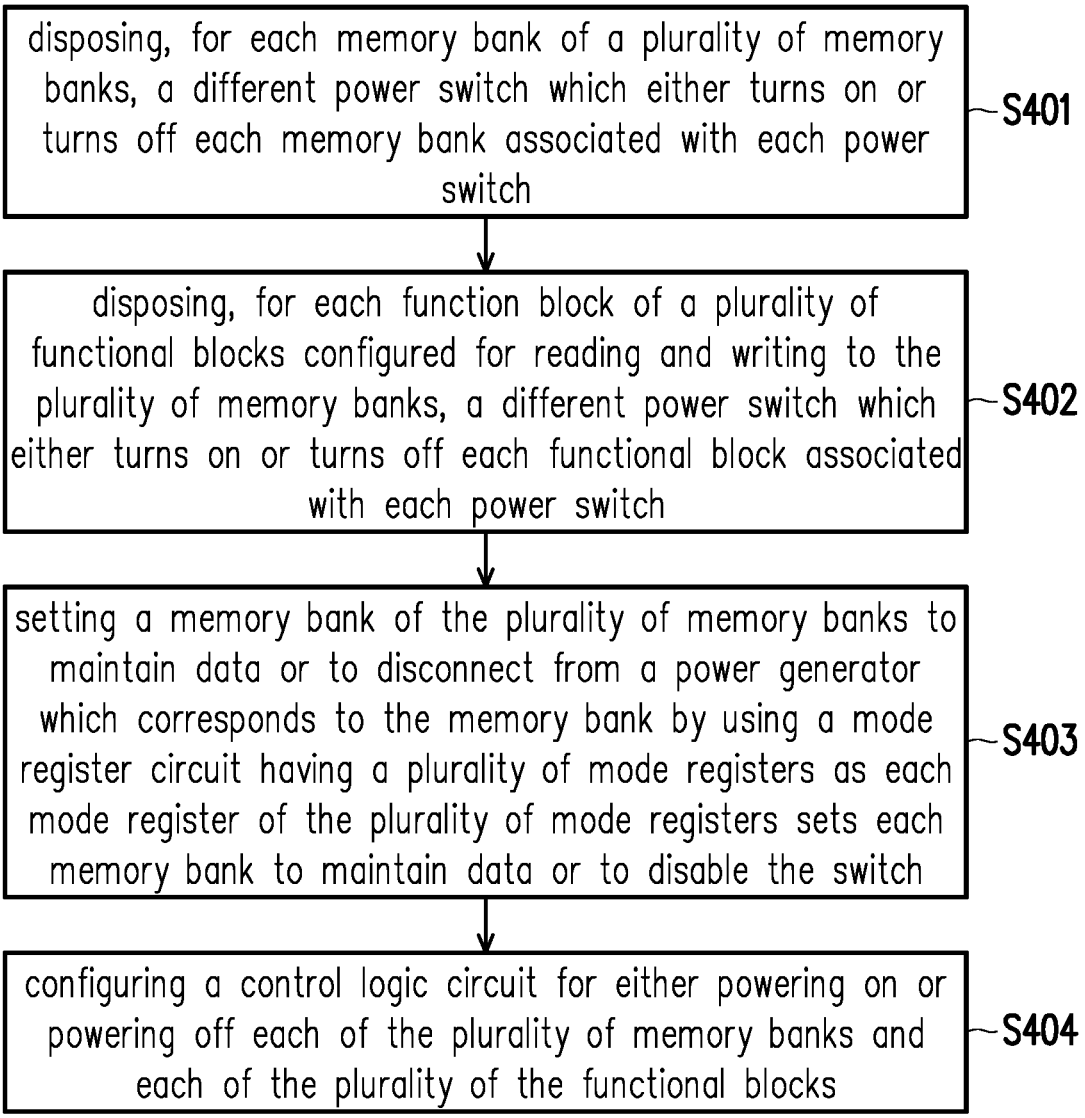
FIG. 4 illustrates a power control method used by a memory device in accordance with one of the exemplary embodiments of the disclosure.

FIG. 4 illustrates a power control method used by a memory device 300 in accordance with one of the exemplary embodiments of the disclosure. In step S401, the memory device 300 would dispose, for each memory bank of a plurality of memory banks, a different power switch which either turns on or turns off each memory bank associated with each power switch. In step S402, the memory device 300 would dispose, for each function block of a plurality of functional blocks configured for reading and writing to the plurality of memory banks, a different power switch which either turns on or turns off each functional block associated with each power switch. In step S403, the memory device 300 would set a memory bank of the plurality of memory banks to maintain data or to disconnect from a power generator which corresponds to the memory bank by using a mode register circuit which may include a plurality of mode registers as each mode register of the plurality of mode registers sets each memory bank to maintain data or to disable the switch. In step S404, the memory device 300 would configure a control logic circuit for either powering on or powering off each of the plurality of memory banks and each of the plurality of the functional blocks by reading from the mode register circuit.

In one of the exemplary embodiments, configuring the control logic circuit for either powering on or powering off each of the plurality of memory banks and each of the plurality of the functional blocks may involve switching either on or off each power switch of the plurality of memory banks; and switching either on or off each power switch of the plurality of the functional blocks. Further, configuring the control logic circuit for switching either on or off each power switch of the plurality of memory banks and for switching either on or off the each power switch of the plurality of the functional blocks may involve configuring the control logic circuit for switching either on or off each power switch of the plurality of memory banks and for switching either on or off the each power switch of the plurality of the functional blocks according to a setting value of a mode register which corresponds to each memory bank and an external command, which could be any one of an active command, a self refresh command, a deep self refresh (DSR) command, a deep power down command, a standby power-down command, and etc.

In one of the exemplary embodiments, the method may further include configuring the mode register circuit to select memory banks of the plurality of memory banks to maintain data stored in the selected memory banks and configuring the control logic circuit to turn on power switches of the selected memory banks and to turn off power switches of un-selected memory banks. The method may also further include configuring the control logic circuit to turn on power switches of functional blocks which are necessary for maintaining the data of the selected memory banks and to turn off power switches of remaining functional blocks which are not necessary for maintaining the data of the selected memory banks.

Figure 5:
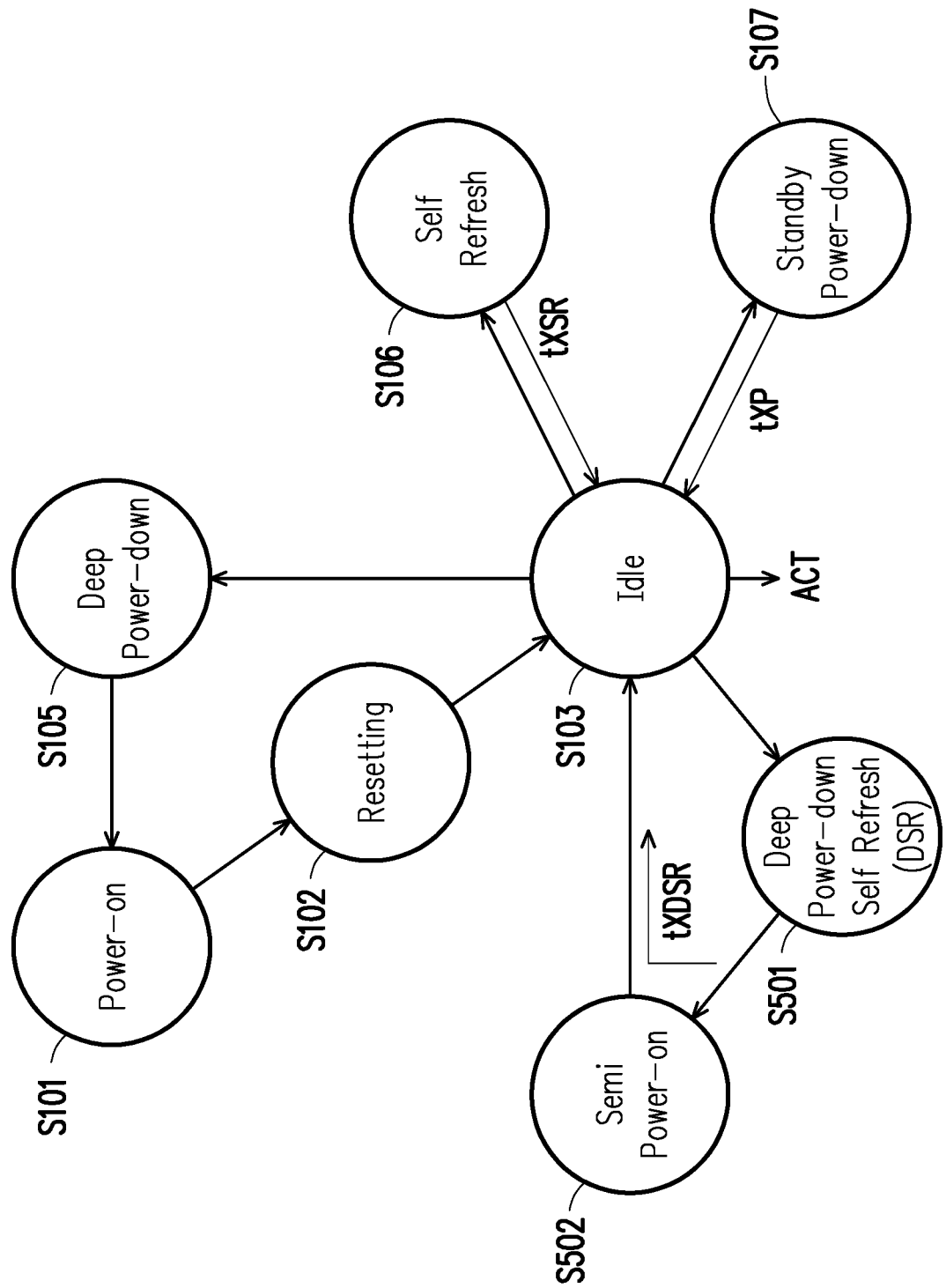
FIG. 5 is a state diagram which shows a memory device entering one of several power saving modes when the memory device is in the idle state in accordance with one of the exemplary embodiments of the disclosure.

FIG. 5 is a state diagram which shows a memory device 300 entering one of several power saving modes when the memory device 300 is in the idle state in accordance with one of the exemplary embodiments of the disclosure, and the elements which are the same as those shown in FIG. 1 are labeled with the same symbol and numerals. In response to the memory device 300 entering the idle mode S103, the memory device 300 after fulfilling certain conditions may enter a deep power down self refresh mode S501 by receiving an external command generated by the memory device 300 to enter into the deep power down self refresh mode. When the memory device 300 enters the deep power down self refresh mode, power generated by one or more generators of the memory device 300 would be decoupled from all of the functional blocks except for the moments when certain functional blocks are necessary for reading from or writing data into the memory array 301. Further, power generated by one or more generators of the memory device 300 would be decoupled from all of the memory arrays except for selected memory bank(s) which need(s) to guarantee maintenance of the data being stored. In S502 during which the memory device 300 is in a semi power on state, all power generated by one or more generators of the memory device 300 would be decoupled from all of the functional blocks and the entire memory array 301 except for selected memory bank(s) of the memory array (e.g. 201, FIG. 2) until a TxDSR command is received by the control logic circuit 302 to exit the DSR mode. Upon exiting the DSR mode, the memory device will once again enter the idle mode S103.

Table 2 shows a comparison between the DSR mode and various other above described power saving modes.

TABLE 2

| Mode | Deep Power Down | DSR | Standby Power Down | Self Refresh |
|---|---|---|---|---|
| Power Saving | Best | Better | Good | Good |
| Data Maintain | No | Yes | No | Yes |

From Table 2, it can be seen that although the proposed DSR mode does not achieve the same level of power saving as the conventional deep power down mode, the DSR mode would nevertheless be able to guarantee non-volatile data storage whereas the deep power down mode would not able to guarantee non-volatile data storage. Moreover, the DSR mode can still achieve better power saving than the conventional standby power down mode and the conventional self refresh mode.

Figure 2:
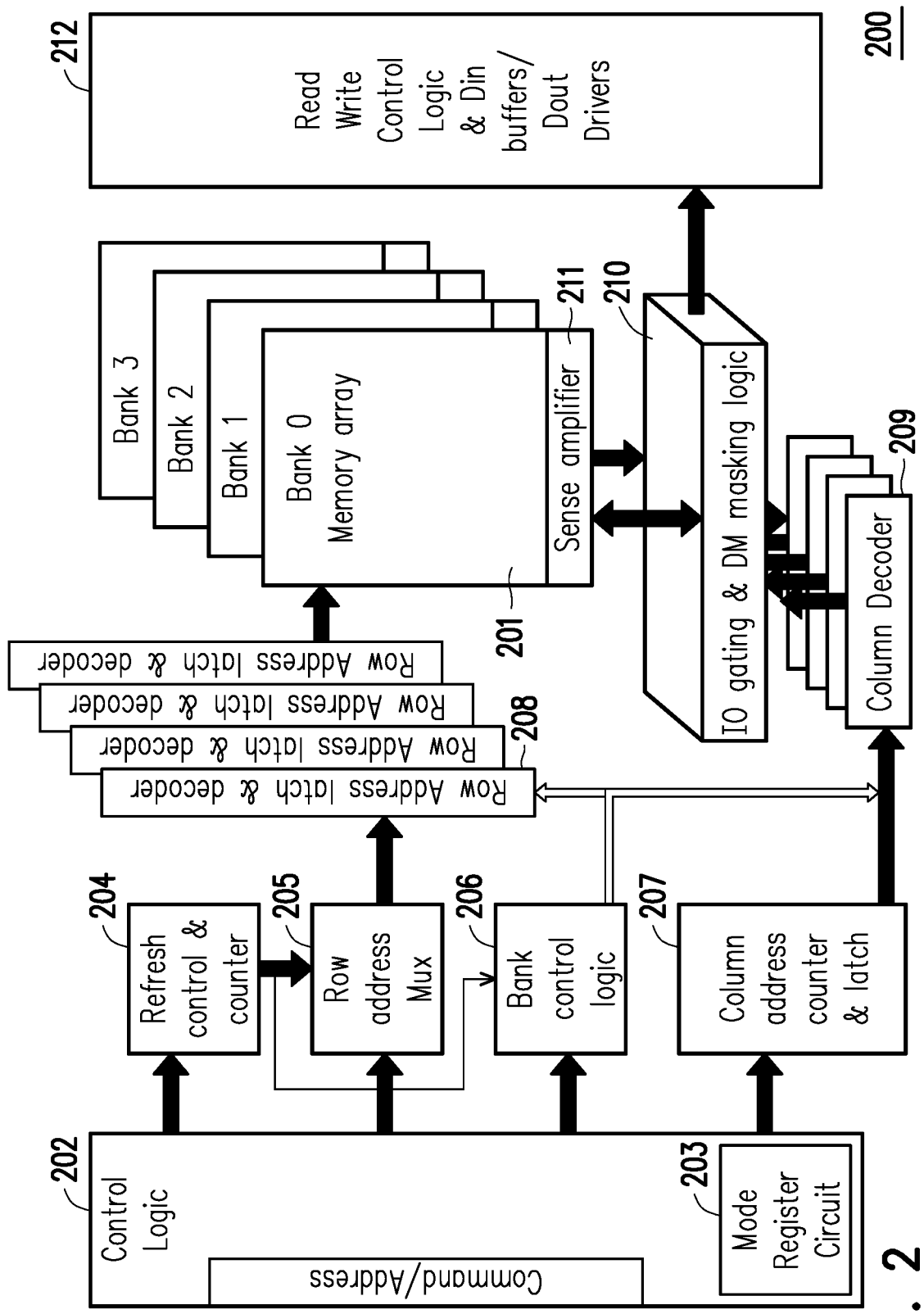
FIG. 2 shows a hardware block diagram of a conventional DRAM device.
Figure 6:
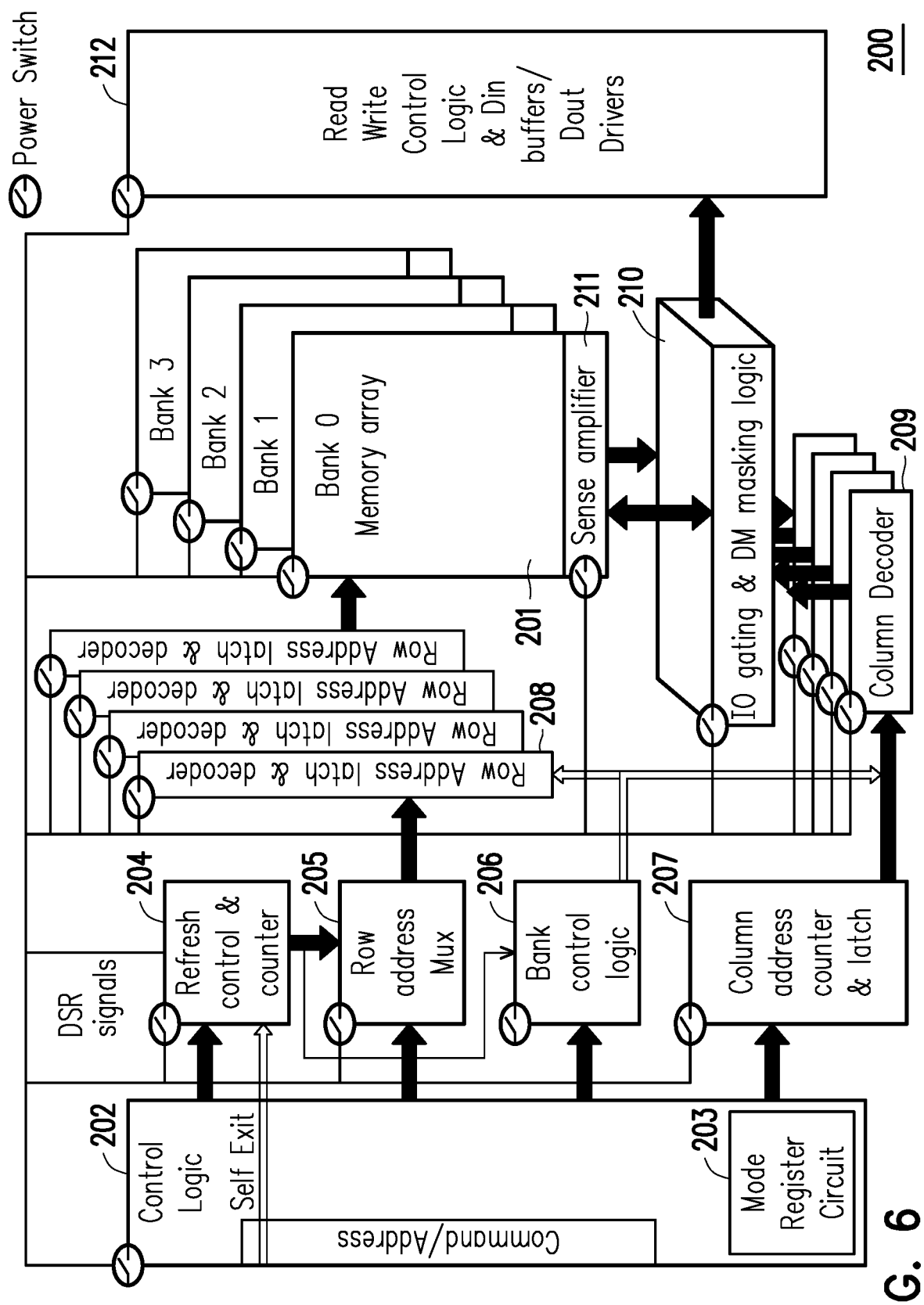
FIG. 6 is a hardware block diagram of a DRAM device in accordance with one of the exemplary embodiments of the disclosure.

FIG. 6 is a hardware block diagram of a memory device in accordance with one of the exemplary embodiments of the disclosure, and the elements which are the same as those shown in FIG. 2 are labeled with the same symbol and numerals. To implement the DSR mode of FIG. 5, the memory device is disposed with a plurality of power switches which would couple or decouple the functional blocks (e.g. 202~214) and the memory array 201 from the power generators of the memory device (i.e. turning on or turning off power). When the memory device enters the DSR mode, the control logic 202 may receive an external command for entering into the DSR mode. The external command could be received from, for example, a central processor (CPU) or a microcontroller that is situated outside of the memory device 200. Moreover, the refresh control & counter circuit 204 would receive DSR signals which are also connected to power switches of each memory banks of the memory array 201 as well as each of the functional blocks (e.g. 202, 203, 204~212) in order to control the power switches to turn each memory bank and each functional block either on or off. The DSR signals may also control each power generators together or individually so as to disable all power generators except those power generators that are needed for the refresh operation.

Thus, the control logic circuit 202 via the refresh control & counter circuit 204 would power on or power off each of the plurality of memory banks and each of the plurality of the functional blocks by switching on or off each power switch of the plurality of memory banks as well as each power switch of each of the functional blocks. The mode register circuit 203 would contain a plurality of mode registers as each of the plurality mode registers may correspond to each individual memory bank of the memory array 201. Each memory bank of the memory array 201 could be individually selected to turn on or to turn off according to an external command and a setting value of each mode register which corresponds to each memory bank.

For example, if the external command indicates entering of the DSR mode, then the memory device 200 would turn off power switches of all functional blocks and memory banks except for memory bank(s) that stores non-volatile data and those functional blocks that support the memory banks(s) to store the non-volatile data. Once read or write operations are complete, all power switches of all functional blocks could be turned off as well as all power switches of all memory banks except for those memory banks that are guaranteed to store and maintain non-volatile data. After the DSR mode is exited upon receiving the tXDSR command, all power generators that have been turned off previously could be turned back on.

Figure 7:
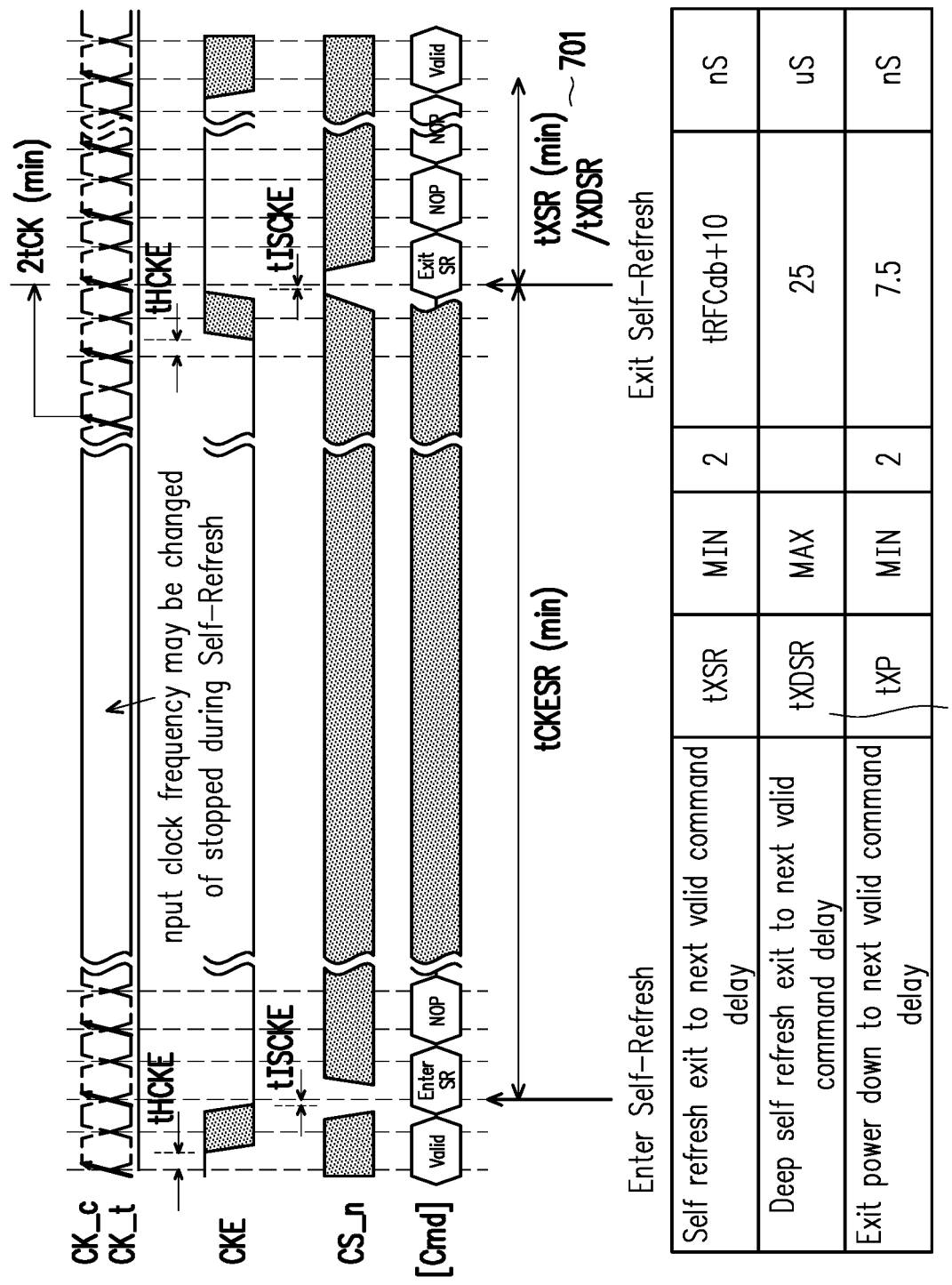
FIG. 7 is a timing diagram which shows an example of DSR exiting timing in accordance with one of the exemplary embodiments of the disclosure.

FIG. 7 is a timing diagram which shows an example of DSR exiting timing in accordance with one of the exemplary embodiments of the disclosure. From the timing diagram of FIG. 7, it can be seen that the execution of the tXDSR command may require around 25 microseconds and therefore the required power on time for exiting the DSR mode could be longer than exiting the self refresh mode (tXSR) or exiting the deep power down mode (tXP).

Figure 8:
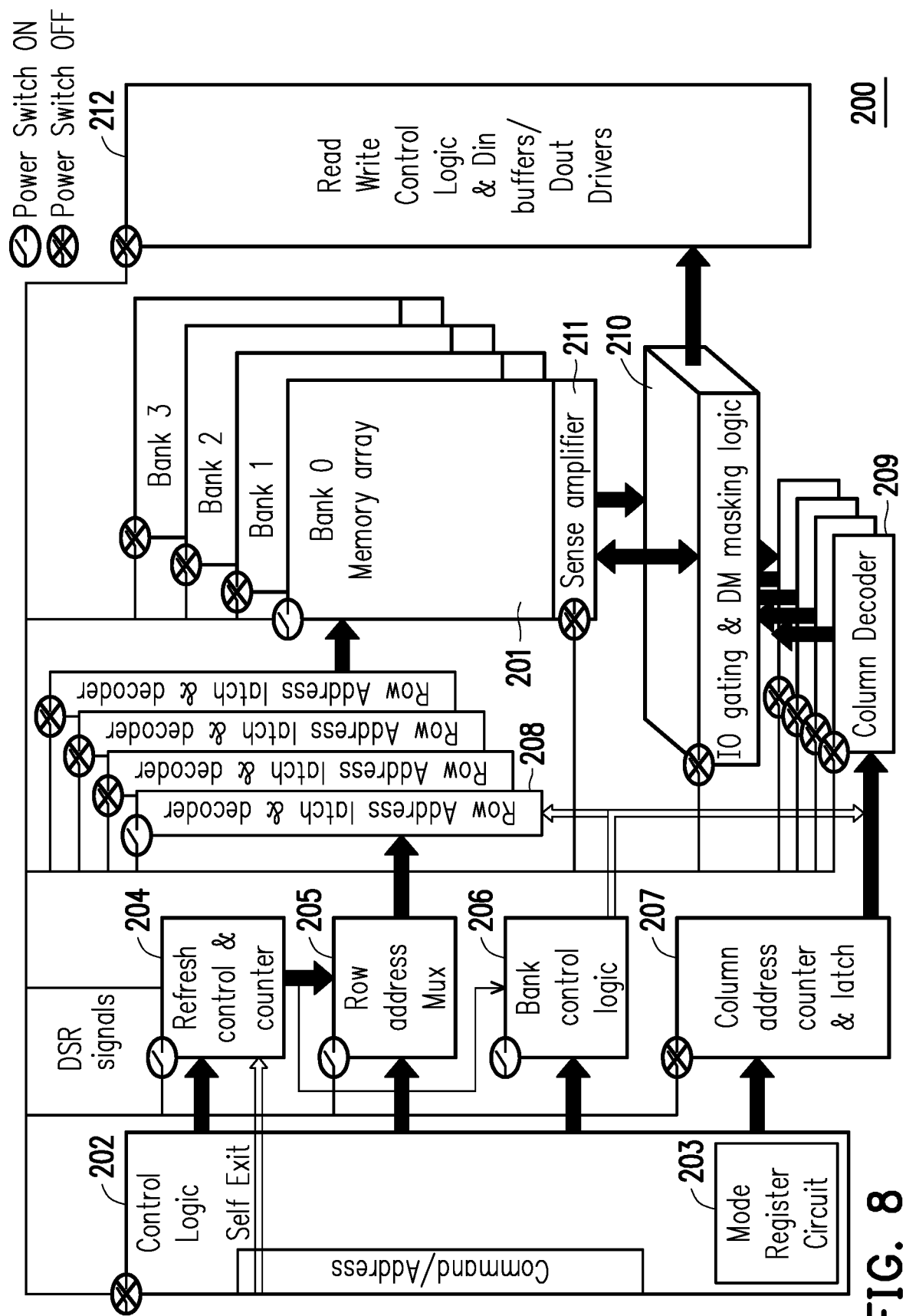
FIG. 8 is an example which shows applying the DSR of the power control method on one memory bank of the memory device in accordance with one of the exemplary embodiments of the disclosure.

FIG. 8 is an example which shows applying the DSR of the power control method on one memory bank of the memory device in accordance with one of the exemplary embodiments of the disclosure, and the elements which are the same as those shown in FIG. 6 are labeled with the same symbol and numerals. Assuming that bank 0 of the memory array 201 will store non-volatile data upon entering the DSR mode S501, the power switches for the refresh control & counter circuit (e.g. 204), the row address multiplexer (e.g. 205), the bank control logic circuit (e.g. 206), the row address latch & decoder (e.g. 208) which corresponds to bank 0, and memory bank 0 will be left on while the power switches of the rest of the functional blocks not related to maintaining the data of bank 0 as well as the rest of the memory banks will be turned off. Upon entering the semi-power on state S502, the power switches for the refresh control & counter circuit (e.g. 204), the row address multiplexer (e.g. 205), the bank control logic circuit (e.g. 206), the row address latch & decoder (e.g. 208) which corresponds to bank 0 will be all turned off except for the power switch of bank 0 of the memory array 201.

Even though the example of FIG. 8 shows just one memory bank which is bank 0, the memory device could be selected to maintain multiple memory banks according to the same principle of operation. The mode registers would be used to select each individual memory bank to maintain data or not to maintain data by setting a value within each mode register which corresponds to each memory bank. The DSR signals could be generated to control the refresh control and counter circuit to enable or disable power switches of each functional block and memory bank. The DSR signals could be transmitted from the logic control circuit 202 or received externally.

By disposing the power switches upon each of the functional blocks (e.g. 202~214) and the memory array 201, the power consumption can be achieved since the leakage current of non-operational functional blocks and memory banks can be reduced. The power switches are not only for VINT but also for VPP as well as other power generators to control the coupling between the power generators and functional blocks & memory array 201. In this way, a memory device would reduce power consumption nearly at the same level as the deep power down mode and can reduce power even more relative to the self refresh mode and the standby power down mode.

In an alternative exemplary embodiment, upon receiving the external command to enter the DSR mode, power generators that correspond to the non-operational functional blocks and memory banks could be disabled by the DSR signals. The disabled power generators could be enabled when the DSR mode is exited upon entering the idle mode S103.

Figure 9:
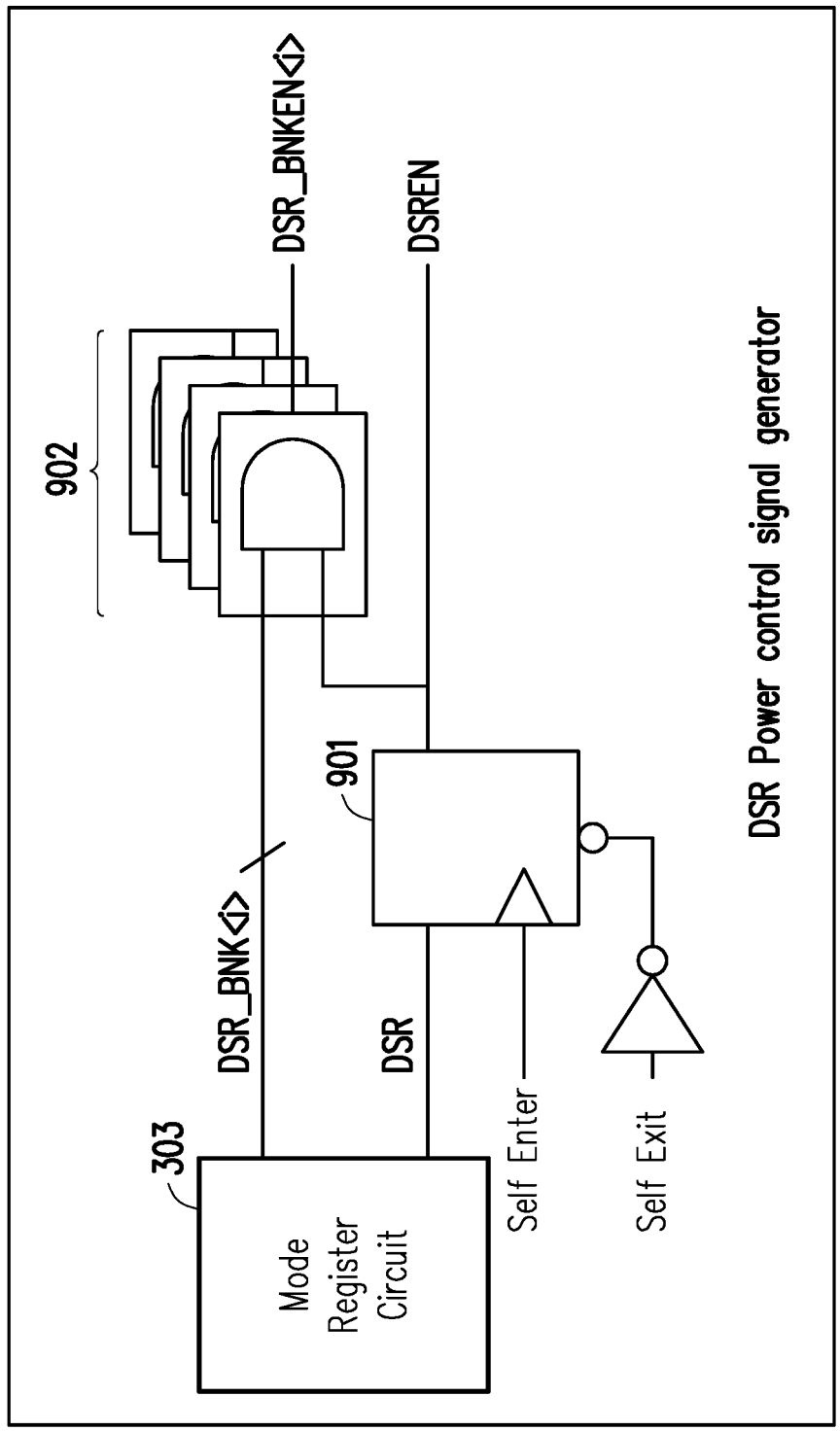
FIG. 9 illustrates a DSR power control signal generator in accordance with one of the exemplary embodiments of the disclosure.

FIG. 9 illustrates an implementation of a DSR power control signal generator disposed within the memory device 300 in accordance with one of the exemplary embodiments of the disclosure. It should be noted that the design of a DSR power control signal generator may vary and thus this disclosure is not limited to this particular design of the DSR power control signal generator. According to FIG. 9, the DSR power control signal generator may include at least but not limited to a flip flop 901 and a plurality AND gates 902. The flip flop would receive the Self Enter and Self exit signals which are conventional signals and DSR signals from the mode register circuit 303. The values stored in each mode register of the mode register circuit 303 would determine which bank of the memory array 301 would maintain data and which bank of the memory array 301 would be turned off. The flip flop 901 would output a DSR enable signal (DSREN) which is a global enable signal that would enable or disable DSR mode for the entire memory array. For example, the logic control circuit 302 may disable all of the power switches of non-operating function blocks during the DSR mode through the mode register circuit 303. Each of the plurality of AND gates would perform an AND operation of the DSR enable signal and each DSR mode bank enable signal (DSR_BNKEN<i>), where i is a non-negative integer and represent the i$^{th}$ memory bank. The DSR mode bank enable signal (DSR_BNKEN<i>) would individually control the power coupling to each individual memory bank (i.e. the i$^{th}$ memory bank) and thus may control one or more banks to remain active in order to guarantee data storage.

In view of the aforementioned descriptions, the present disclosure is suitable for being used in a memory device such as a DRAM device and is able to achieve power saving at a level that is comparable to but slightly less than the deep power down mode which is the most power efficient power saving mode but at the same time guarantee that the data intended to be stored will be safely stored.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A memory device comprising:
 a plurality of memory banks, each comprising a different power switch which either turns on or turns off each corresponding memory bank of the plurality of memory banks;
 a plurality of functional blocks, comprising:
  a plurality of refresh control and counters;
  a plurality of row address multiplexers;
  a plurality of bank control logic circuits; and
  a plurality of row address latch and decoders,
  the plurality of functional blocks for reading and writing to the plurality of memory banks and comprising a plurality of power switches as each functional block of the plurality of functional blocks has a different power switch which either turns on or turns off the functional block;
 a mode register circuit comprising a plurality of mode registers as each mode register of the plurality of mode registers determines a memory bank of the plurality of memory banks to maintain data or to disconnect from a power generator which corresponds to the memory bank; and
 a control logic circuit configured to turn on power switches of selected memory banks and to turn off power switches of un-selected memory banks based on a setting value of each mode register which corresponds to each memory bank,
 wherein the control logic circuit is further configured to turn on power switches of refresh control and counters, row address multiplexers, bank control logic circuits and row address latch and decoders which are necessary for maintaining the data of the selected memory banks,
 wherein the control logic circuit is further configured to turn off power switches of refresh control and counters, row address multiplexers, bank control logic circuits and row address latch and decoders which are not necessary for maintaining the data of the selected memory banks.

2. The memory device of claim 1, wherein the control logic circuit is configured to turn on power switches of selected memory banks and to turn off power switches of un-selected memory banks based on the setting value of each mode register which corresponds to each memory bank comprising:

the control logic circuit is configured to turn on power switches of selected memory banks and to turn off power switches of un-selected memory banks based on the setting value of each mode register which corresponds to each memory bank and an external command.

3. The memory device of claim 2, wherein the external command comprises one of an active command, a self refresh command, a deep self refresh (DSR) command, a deep power down command, and a standby power-down command.

4. The memory device of claim 2, wherein the external command is a deep self refresh (DSR) command, and in response to receiving the DSR command, all power generators of unselected memory banks and functional blocks which are not necessary for maintaining the data of the selected memory banks are turned off.

5. The memory device of claim 4, wherein all power generators that have been turned off in response to receiving the DSR command are turned back on response to receiving a DSR exit command.

6. The memory device of claim 4 further comprising a deep self refresh (DSR) power control signal generator comprising:

a flip flop which receives the DSR command from the mode register circuit; and a plurality of AND gates which receives an output of the flip flop and the setting value of each mode register for either powering on or powering off each of the plurality of memory banks and each of the plurality of the functional blocks.

7. A power control method used by a memory device, the method comprising:

disposing, for each memory bank of a plurality of memory banks, a different power switch which either turns on or turns off each memory bank associated with each power switch;

disposing, for each function block of a plurality of functional blocks, the plurality of functional blocks comprising a plurality of refresh control and counters, a plurality of row address multiplexers, a plurality of bank control logic circuits and a plurality of row address latch and decoders, the plurality of functional blocks configured for reading and writing to the plurality of memory banks, a different power switch which either turns on or turns off each functional block associated with each power switch;

setting a memory bank of the plurality of memory banks to maintain data or to disconnect from a power generator which corresponds to the memory bank by using a mode register circuit comprising a plurality of mode registers as each mode register of the plurality of mode registers sets each memory bank to maintain data or to disable the switch;

configuring a control logic circuit for either powering on or powering off each of the plurality of memory banks and each of the plurality of the functional blocks by reading from the mode register circuit;

configuring the mode register circuit to select memory banks of the plurality of memory banks to maintain data stored in the selected memory banks, and configuring the control logic circuit to turn on power switches of the selected memory banks and to turn off power switches of un-selected memory banks;

configuring the control logic circuit to turn on power switches of refresh control and counters, row address multiplexers, bank control logic circuits and row address latch and decoders which are necessary for maintaining the data of the selected memory banks; and configuring the control logic circuit to turn off power switches of refresh control and counters, row address multiplexers, bank control logic circuits and row address latch and decoders which are not necessary for maintaining the data of the selected memory banks.

8. The method of claim 7, wherein configuring the control logic circuit to turn on power switches of the selected memory banks and to turn off power switches of un-selected memory banks comprising:

configuring the control logic circuit to turn on power switches of selected memory banks and to turn off power switches of un-selected memory banks according to a setting value of a mode register which corresponds to each memory bank and an external command.

9. The method of claim 8, wherein the external command comprises one of an active command, a self refresh command, a deep self refresh (DSR) command, a deep power down command, and a standby power-down command.

10. The method of claim 8, wherein the external command is a deep self refresh (DSR) command, and in response to receiving the DSR command, all power generators of unselected memory banks and functional blocks which are not necessary for maintaining the data of the selected memory banks are turned off.

11. The method of claim 10 wherein all power generators that have been turned off in response to receiving the DSR command are turned back on response to receiving a DSR exit command.

12. The method of claim 10 further comprising using a deep self refresh (DSR) power control signal generator comprising a flip flop which receives the DSR command from the mode register circuit and a plurality of AND gates which receives an output of the flip flop and the setting value of each mode register for either powering on or powering off each of the plurality of memory banks and each of the plurality of the functional blocks.

* * * * *